(12) United States Patent
Ding et al.

(10) Patent No.: US 6,960,822 B2
(45) Date of Patent: Nov. 1, 2005

(54) SOLDER MASK AND STRUCTURE OF A SUBSTRATE

(75) Inventors: Yi-Chuan Ding, Kaohsiung (TW); Yung-I Yeh, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/604,650

(22) Filed: Aug. 7, 2003

(65) Prior Publication Data

US 2004/0137659 A1 Jul. 15, 2004

(30) Foreign Application Priority Data

Aug. 15, 2002 (TW) ........................................ 91118368 A (51) Int. Cl.⁷ ............................................. H01L 39/00
(52) U.S. Cl. ...................... 257/633; 257/632; 257/637; 257/774
(58) Field of Search ................................ 257/787–796, 257/632–634; 438/106, 124–125

(56) References Cited

U.S. PATENT DOCUMENTS

| 5,218,234 A | * | 6/1993 | Thompson et al. ......... 257/787 |
| 5,665,526 A | * | 9/1997 | Markovich et al. ......... 430/325 |
| 2003/0184979 A1 | * | 10/2003 | Tsai et al. .................... 361/748 |
| 2004/0080027 A1 | * | 4/2004 | Grigg et al. ................ 257/667 |

* cited by examiner

*Primary Examiner*—Dung A. Le
(74) *Attorney, Agent, or Firm*—Jiang Chyun IP Office (57) ABSTRACT

A substrate includes a dielectric structure, an interconnection structure and a solder mask. The interconnection structure interlaces inside the dielectric structure. The solder mask covers the dielectric structure. The material of the solder mask can be the same as that of the dielectric structure contacting the solder mask. The material of the solder mask can be epoxy resin or bismaleimide-triazine.

11 Claims, 11 Drawing Sheets

SOLDER MASK AND STRUCTURE OF A SUBSTRATE

CROSS REFERENCE TO RELATED APPLICATIONS

This application claims the priority benefit of Taiwan application serial no. 91118368, filed Aug. 15, 2002.

BACKGROUND OF INVENTION

1. Field of the Invention

The invention relates in general to a method of fabricating a solder mask and a structure of a substrate. More particularly, the invention relates to a structure of a substrate enduring relatively poor surroundings and a method of fabricating a solder mask of the substrate.

2. Description of the Related Art

Recently, following the change of electronics technology with each passing day, high-tech electronic products with relatively comfort and multi-function have been presented to the public one after another. The nucleus of the electronic products is chips electrically connecting with other chips or passive units through a substrate. Generally, spread on a surface of the substrate is a solder mask that can prevent solder from extending to neighboring conductive pads during a reflow process and, therefore, can avoid short circuits. The method of fabricating the solder mask is described as follows.

Figure 1:
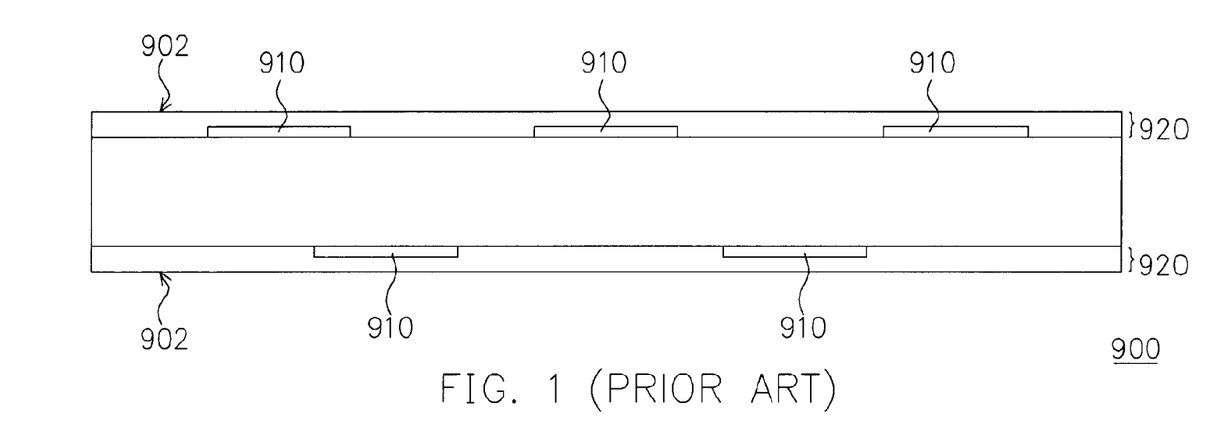
FIG. 1 and FIG. 2 are schematic cross-sectional views showing a process of forming a conventional solder mask of a substrate.
Figure 2:
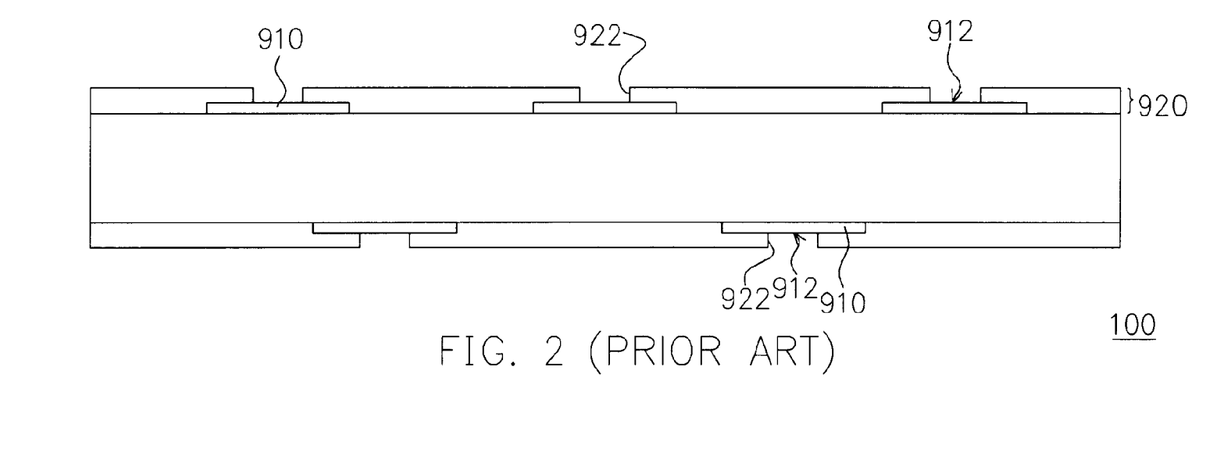

FIG. 1 and FIG. 2 are schematic cross-sectional views showing a process of forming a conventional solder mask of a substrate. Referring to FIG. 1, After a outermost metal layer 910 is formed, a solder mask 920 is formed on a surface 902 of the substrate 900 using a spin-coating method and the solder mask 920 covers the metal layer 910. The material of the solder mask 920 is, for example, a photo-imageable dielectric. Subsequently, using an exposure process and a developing process, a pattern can be transferred to the solder mask 920 so that many openings 922 are formed through the solder mask 920 and expose the metal layer 910, as shown in FIG. 2. Finally, a curing process is used to harden the solder mask 920. The manufacture of the solder mask 920 is finished so far. The metal layer 910 exposed through the openings 922 of the solder mask 920 is defined as conductive pads 912 by which the substrate 900 can be electrically connected with outer circuits.

In the above process, generally, the dielectric material inside the substrate 900 is bismaleimide-triazine (BT) or epoxy resin that is different from the material of the solder mask 920. Moreover, the glass transition temperature of the solder mask 920 is even low. Therefore, the substrate cannot be applied under poor conditions, for example, under lead-free reflow conditions where the temperature should be raised up to over 200 degree. C. or under a moisture sensitive condition I or II (MSC I or MSC II). When the substrate 900 is under poor surroundings, the expansion stress of the solder mask 920 can be so high that the solder mask 920 can be likely separated from a molding compound or from the inner material of the substrate 900. Consequently, the solder mask 920 is the most fragile portion in a package structure.

SUMMARY OF INVENTION

It is an objective according to the present invention to provide a method of fabricating a solder mask and a structure of a substrate with reducing chance that the solder mask is separated from the inner material of the substrate.

It is another objective according to the present invention to provide a method of fabricating a solder mask and a structure of a substrate with reducing chance that the solder mask is delaminated from a molding compound.

To achieve the foregoing and other objectives, the present invention provides a substrate comprising a dielectric structure, an interconnection structure and a solder mask. The interconnection structure interlaces inside the dielectric structure. The solder mask covers the dielectric structure. The material of the solder mask can be the same as that of the dielectric structure contacting the solder mask. The material of the solder mask can be epoxy resin or bismaleimide-triazine.

To achieve the foregoing and other objectives, the present invention provides A method of fabricating a solder mask, suitable for forming the solder mask onto a semifinished substrate. The semifinished substrate includes a dielectric structure and an interconnection structure. First, the solder mask is formed onto the semifinished substrate and then a metal layer is formed onto the solder mask. Subsequently, the metal layer is patterned to form at least one metal-layer opening through the metal layer and the metal-layer opening exposes the solder mask. Next, the solder mask is patterned to form at least one solder-mask opening through the solder mask. The solder-mask opening exposes the interconnection structure and connects with the metal-layer opening. Finally, the metal layer is removed.

To sum up, the material of the solder mask can be the same as that of a dielectric layer of the dielectric structure, the solder mask contacting the dielectric layer, so the physical characteristics of the solder mask are similar with those of the dielectric layer. Therefore, the connection between the solder mask and dielectric layer is excellent. When the substrate is affected by the heat, both the solder mask and the dielectric layer expand to the same extent, thereby reducing the expansion stresses created between the solder mask and the dielectric layer. Therefore, even if the substrate experiences poor conditions, the delamination of the solder mask from the dielectric layer can be substantially avoided. Moreover, the material of the solder mask can be bismaleimide-triazine (BT) or epoxy resin, both of which are of high glass transition temperature, hence capable of enduring poor conditions. Under poor conditions, the solder mask is of relatively low expansion rate, so the delamination of the solder mask from the dielectric layer and the delamination of the solder mask from the molding compound can be substantially avoided.

Both the foregoing general description and the following detailed description are exemplary and explanatory only and are not restrictive of the invention, as claimed. It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 3:
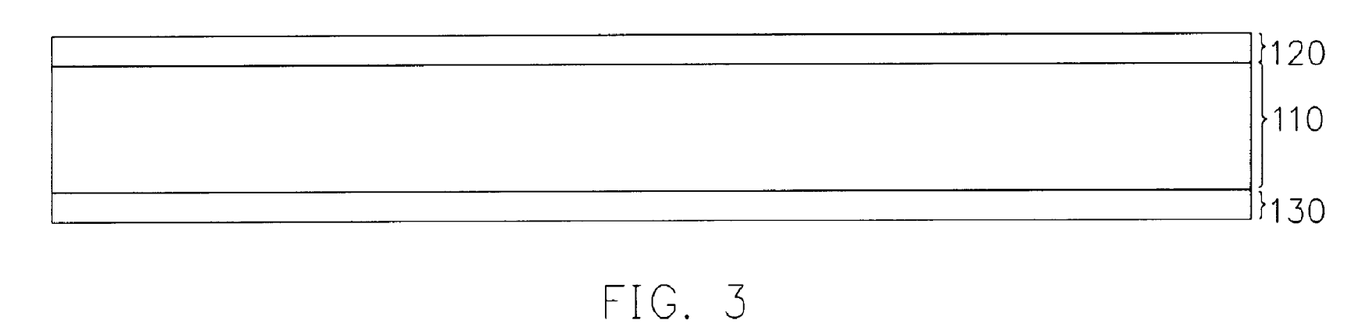
FIGS. 3–15 are schematic cross-sectional views showing a process of forming a substrate according to a preferred embodiment of the present invention.
Figure 4:
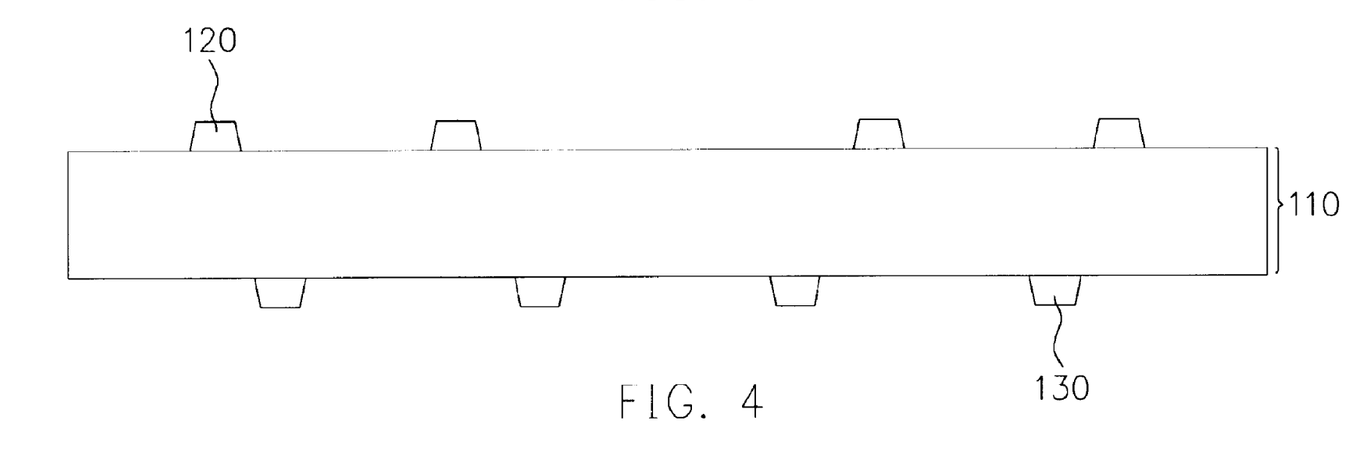

FIGS. 3–15 are schematic cross-sectional views showing a process of forming a substrate according to a preferred embodiment of the present invention. First, referring to FIG. 3, a core layer 110 is provided wherein the material of the core layer 110 is, for example, bismaleimide-triazine (BT) or epoxy resin. Formed on the two sides of the core layer 110 are many metal layers respectively or formed on only one side of the core layer 110 is at least one metal layer. The embodiment has an example of a four-layer substrate where two metal layers are formed on every two sides of the core layer respectively. After the core layer 110 is provided, two metal layers 120, 130 are respectively formed on the both two sides of the core layer 110 using a sputter process, using an evaporation process or using an electroless-plating process with an electroplating process. Following, a photolithography process and an etching process are used to pattern the metal layers 120, 130, as shown in FIG. 4.

Figure 5:
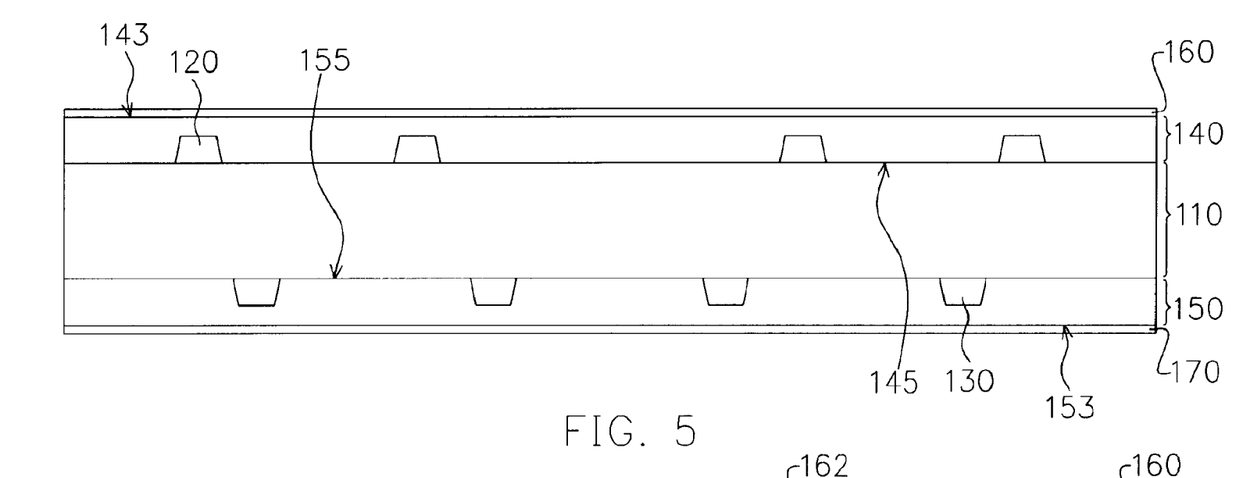

Subsequently, referring to FIG. 5, a built-up method can be used to fabricate dielectric layers and other metal layers on the both two sides of the core layer respectively. A spin-coating process can be first used to form dielectric layers 140, 150 on the both two sides of the core layer 110 respectively. The dielectric layer 140 covers the metal layer 120 and the core layer 110 and the dielectric layer 150 covers the metal layer 130 and the core layer 110. The material of the dielectric layers 140, 150 is, for example, bismaleimide-triazine (BT) or epoxy resin. Afterwards, two metal layers 160, 170 are respectively formed on the dielectric layers 140, 150 using a sputter process, using an evaporation process or using an electroless-plating process with an electroplating process. Otherwise, a laminate method can be used to fabricate dielectric layers and metal layers on the both two sides of the core layer respectively. In the laminate method, first, using a sputter process, using an evaporation process or using an electroless-plating process with an electroplating process, the metal layers 160 can be formed on a surface 143 of the dielectric layer 140 and the metal layers 170 is formed on a surface 153 of the dielectric layer 150. Next, using a heat press process, the dielectric layers 140, 150 are respectively pressed onto the both sides of the core layer 110, wherein another surface 145 of the dielectric layer 140 is contacted with the metal layer 120 and the core layer 110 and another surface 155 of the dielectric layer 150 is contacted with the metal layer 130 and the core layer 110.

Figure 6:
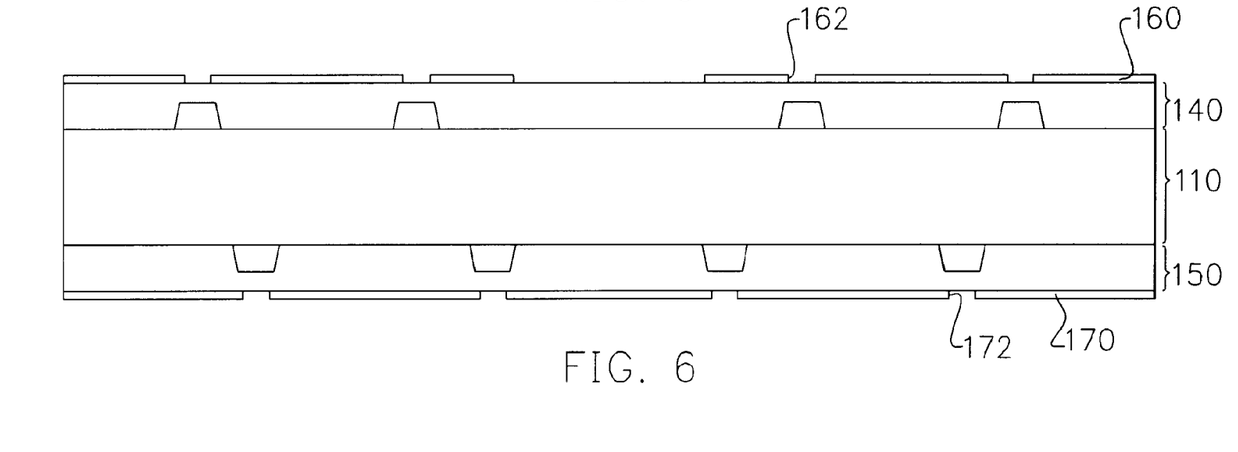

After the built-up method or the laminate method is used to fabricate the dielectric layers 160, 170 and the metal layers 160, 170, a photolithography process and an etching process are used to pattern the metal layers 160, 170, as shown in FIG. 6. Many openings 162 exposing the dielectric layer 140 are formed through the metal layer 160. Many openings 172 exposing the dielectric layer 150 are formed through the metal layer 170.

Figure 7:
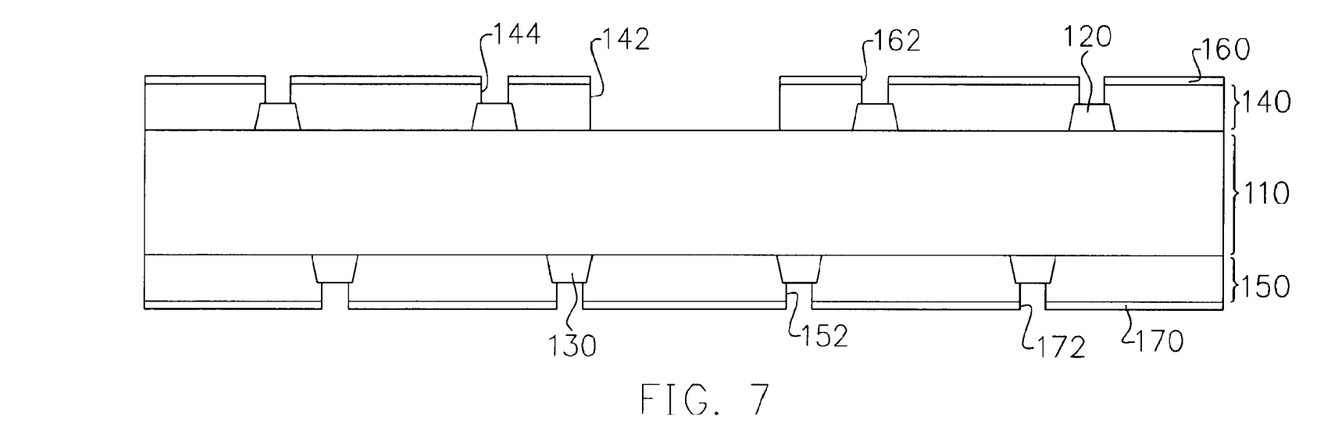

Next, referring to FIG. 7, a laser method or a plasma method is used to remove the dielectric layers 140, 150 exposed through the openings 162, 172 respectively so that the dielectric layer 140 is formed with a first opening 142 exposing the core layer 110 and many second opening 144 exposing the metal layer 120 and the dielectric layer 150 is formed with many opening 152 exposing the metal layer 130.

Figure 8:
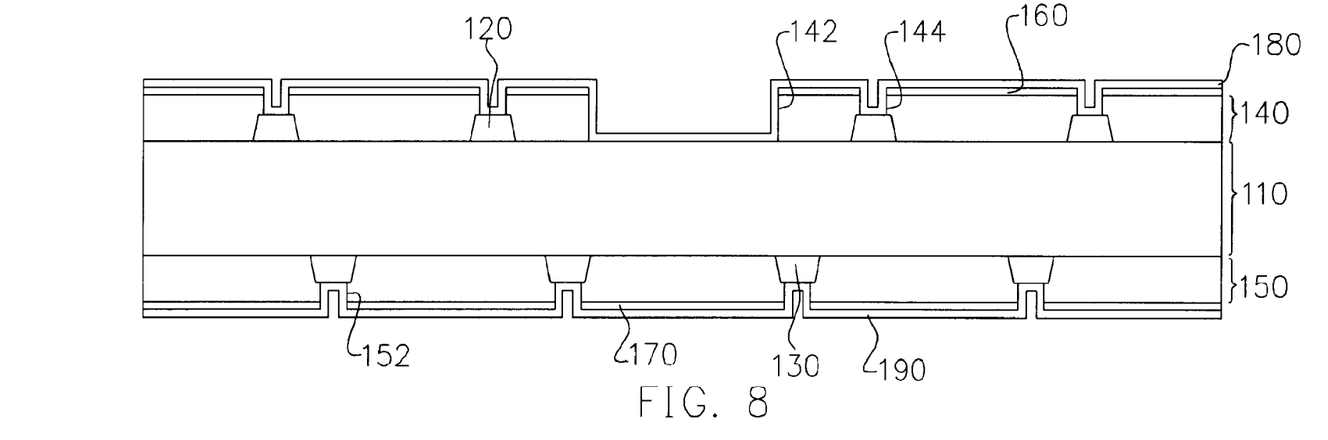

Following, referring to FIG. 8, a sputter process or an electroless-plating process with electroplating process is used to form a metal layer 180 into the first opening 142 of the dielectric layer 140, into the second openings 144 of the dielectric layer 140, on the metal layer 160, on the metal layer 120 and on the core layer 110 and to form a metal layer 190 into the opening 152 of the dielectric layer 150, on the metal layer 170 and on the metal layer 130.

Figure 9:
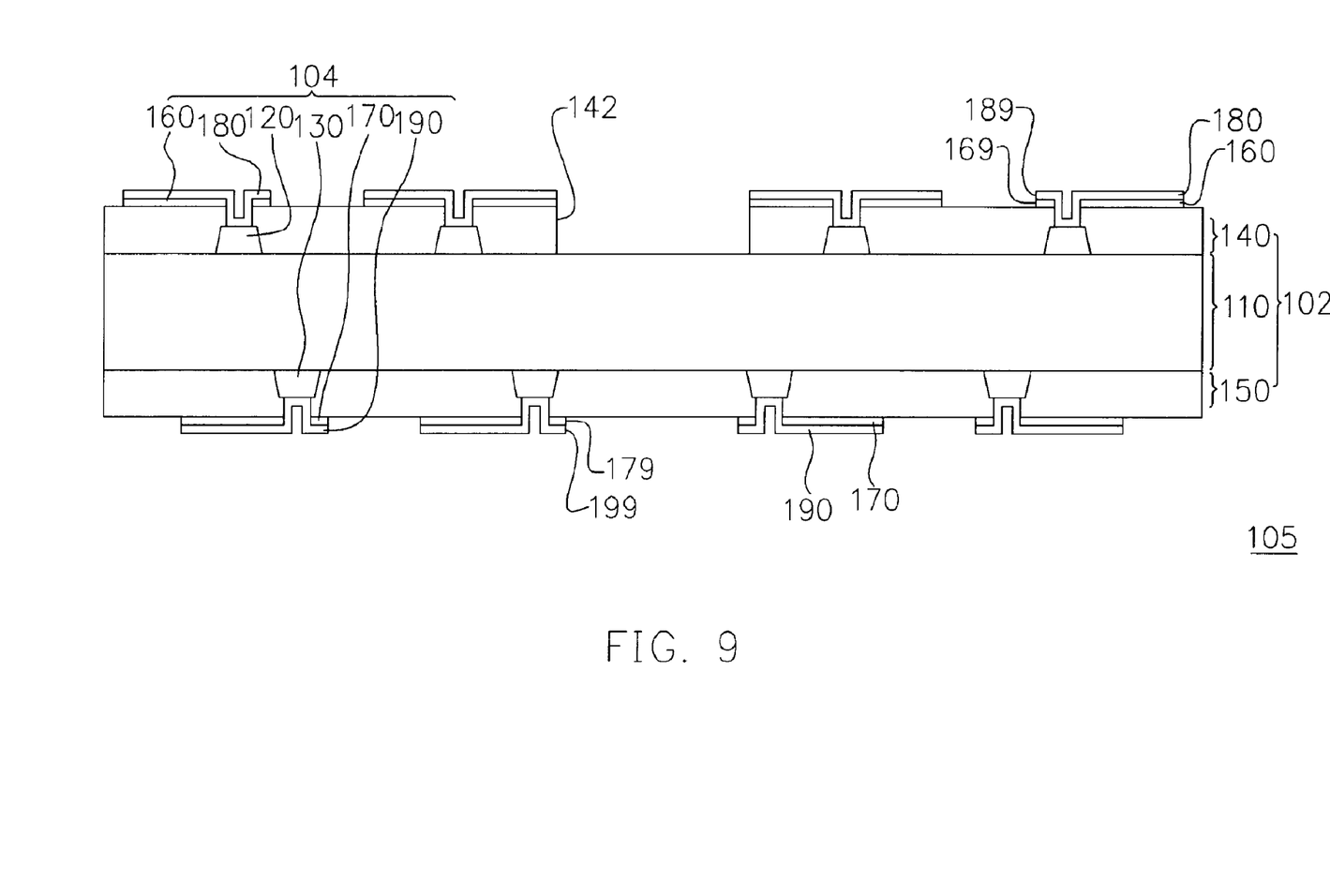

Following, referring to FIG. 9, a photolithography process and an etching process are used to pattern the metal layer 180 and the metal layer 160. The metal layer 180 and the metal layer 160 are formed with many openings 169 and many openings 189 respectively and each of the openings 169 is connected with the corresponding openings 189. The dielectric layer 140, the core layer 110 and the first opening 142 of the dielectric layer 140 are exposed through the openings 169 and the openings 189. Moreover, a photolithography process and an etching process are used to pattern the metal layer 190 and the metal layer 170. The metal layer 190 and the metal layer 170 are formed with many openings 179 and many openings 199 respectively and each of the openings 179 is connected with the corresponding openings 199. The dielectric layer 150 is exposed through the openings 179 and the openings 199. A semifinished substrate 105 is fabricated so far. The semifinished substrate is formed with a dielectric structure 102 and an interconnection structure 104 wherein the interconnection structure 104 interlaces inside the dielectric structure 102. The dielectric structure 102 is constructed from the dielectric layers 140, 150 and the core layer 110. The interconnection structure 104 is constructed from the metal layers 120, 130, 160, 170, 180 and 190.

Figure 10:
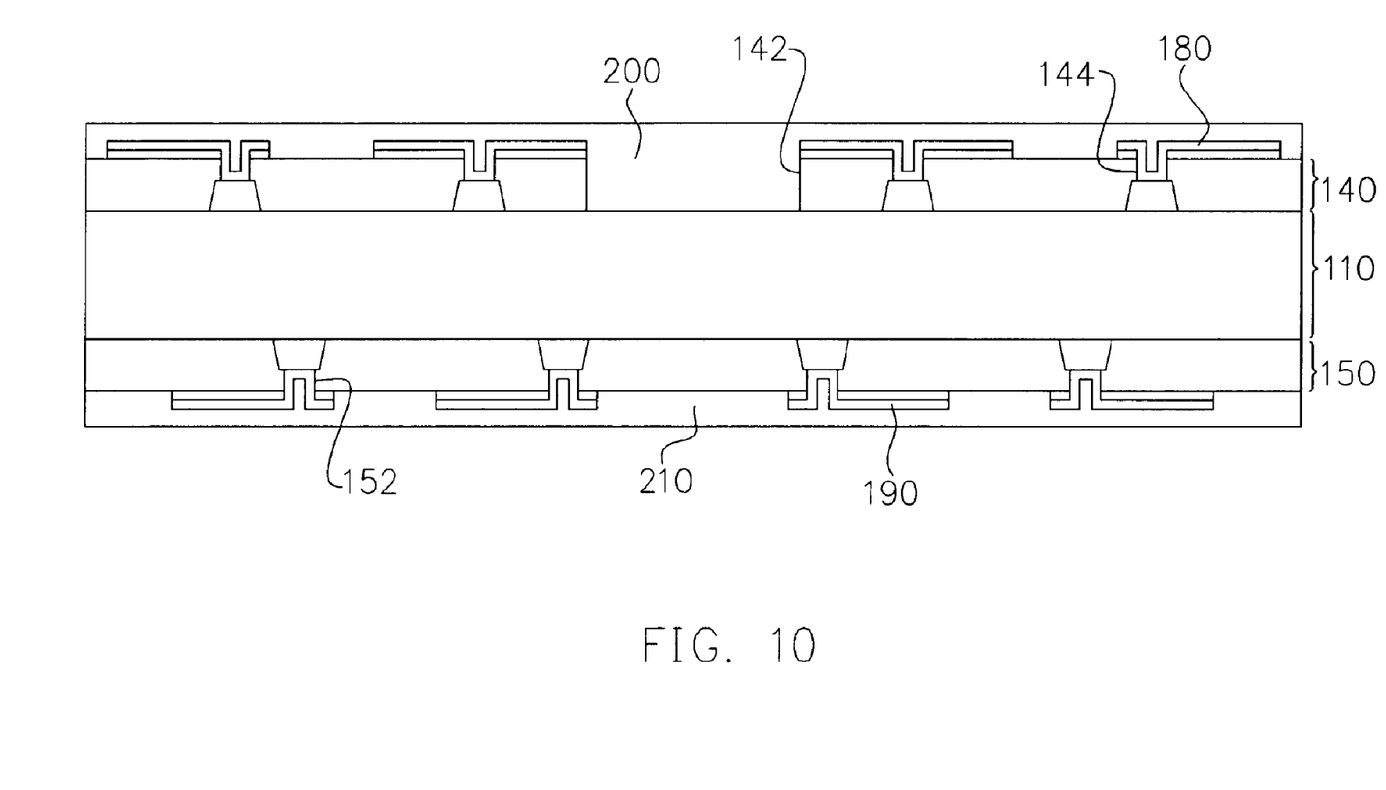
Figure 11:
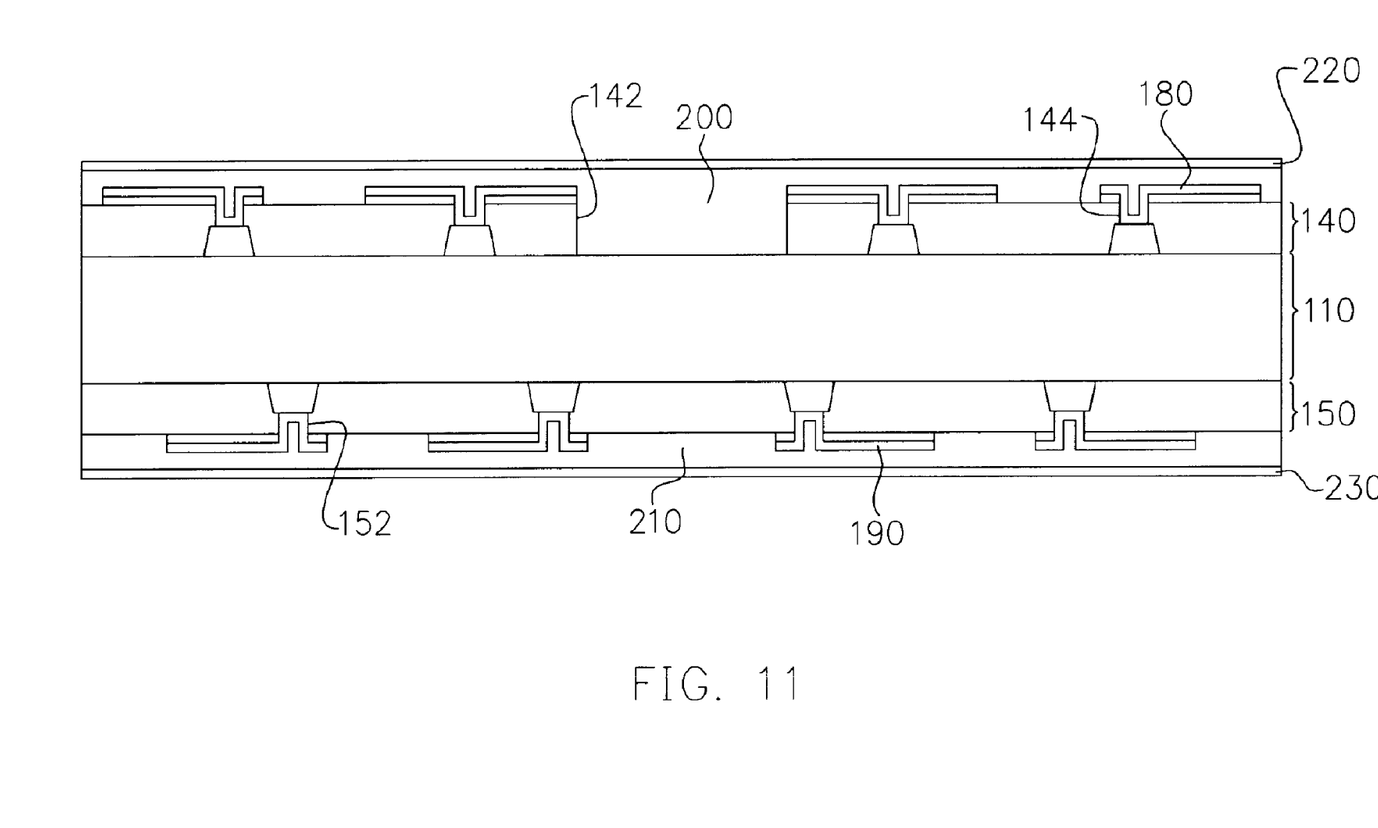

Next, referring to FIG. 10, a built-up method can be used to fabricate solder masks and metal layers. A spin-coating process can be first used to form a solder mask 200 into the first opening 142, into the second openings 144, on the metal layer 180, on the dielectric layer 140 and on the core layer 110 and to form a solder mask 210 into the openings 152, on the metal layer 190 and on the dielectric layer 150. The solder masks 200, 210 can be a material having a glass transition temperature of about 200. degree. C. or over, for example, bismaleimide-triazine (BT) or epoxy resin. Afterwards, two metal layers 220, 230 are respectively formed on the solder masks 200, 210 using a sputter process, using an evaporation process or using an electroless-plating process with an electroplating process, as shown in FIG. 11. The material of the metal layers 220, 230 is, for example, copper. The thickness of the metal layers 220, 230 ranges, for example, from 2 micron meters to 20 micron meters.

Otherwise, a laminate method also can be used to fabricate solder masks and metal layers. First, the metal layers 220, 230 are formed on surfaces of the solder masks 220, 210 respectively using a sputter process, using an evaporation process or using an electroless-plating process with an electroplating process. Next, using a heat press process, the solder mask 200 where the metal layer 220 is formed is pressed into the first opening 142, into the second openings 144, on the metal layer 180, on the dielectric layer 140 and the core layer 110. A heat press process is used to press the solder mask 210 on which the metal layer 230 is formed into the openings 152, on the metal layer 190 and on the dielectric layer 150.

Figure 12:
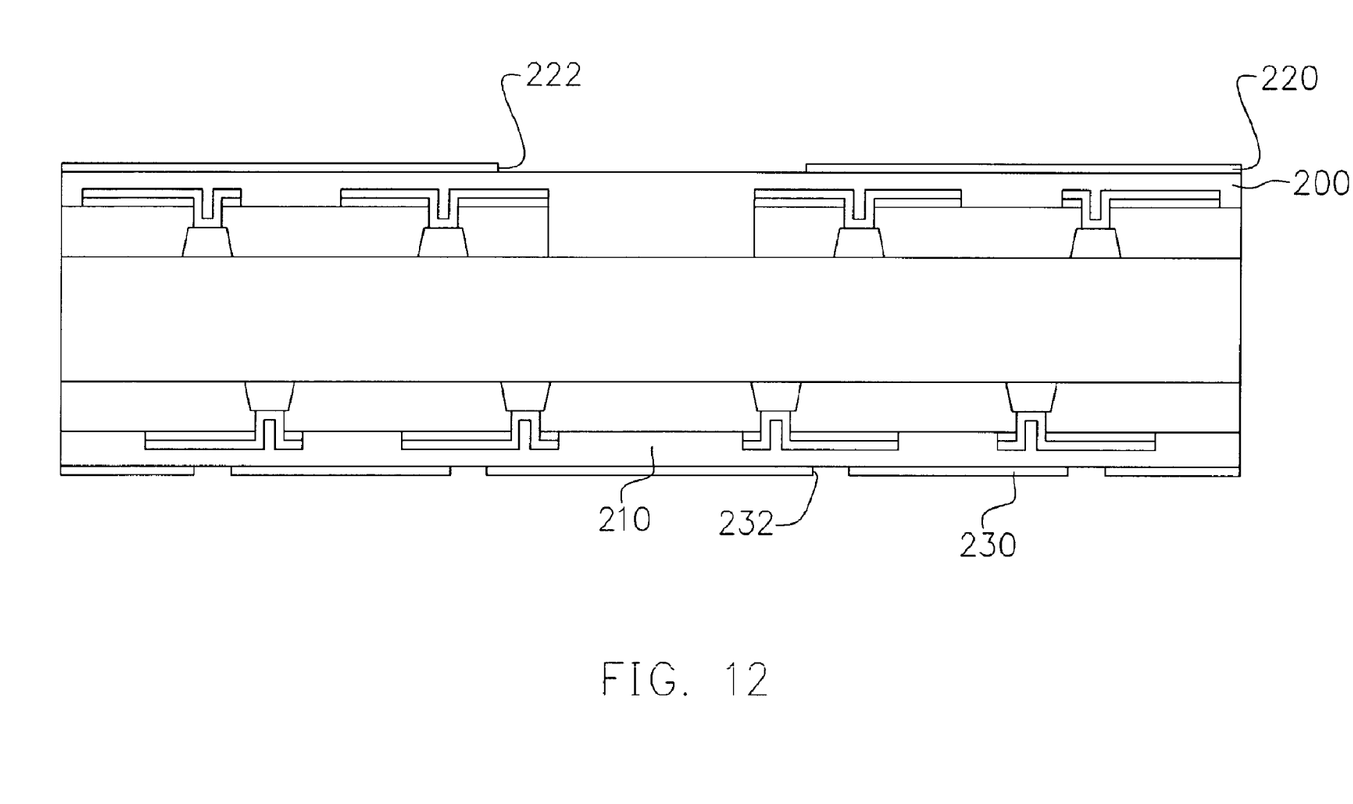

Afterwards, referring to FIG. 12, a photolithography process and an etching process are used to pattern the metal layers 220, 230. An opening 222 exposing the solder mask 200 is formed through the metal layer 220. Many openings 232 exposing the solder mask 210 are formed through the metal layer 230.

Figure 13:
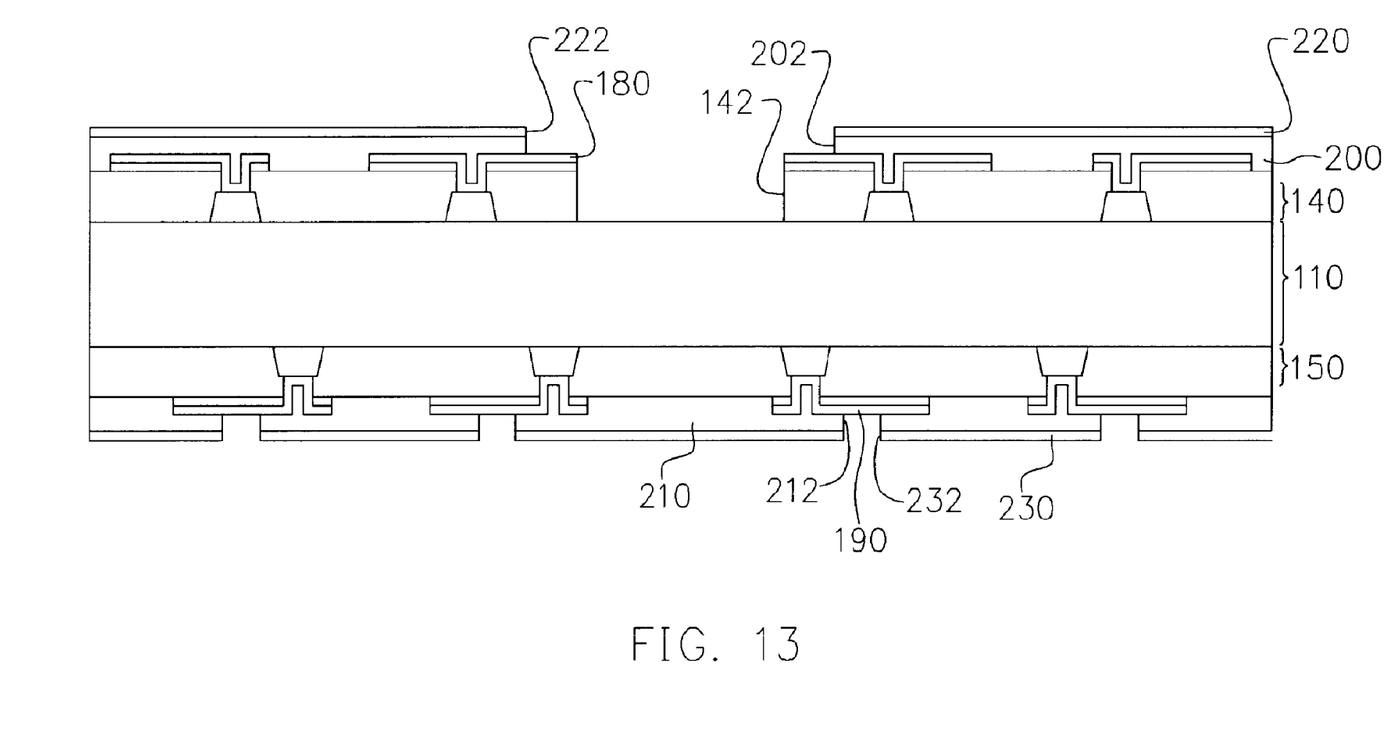
Figure 14:
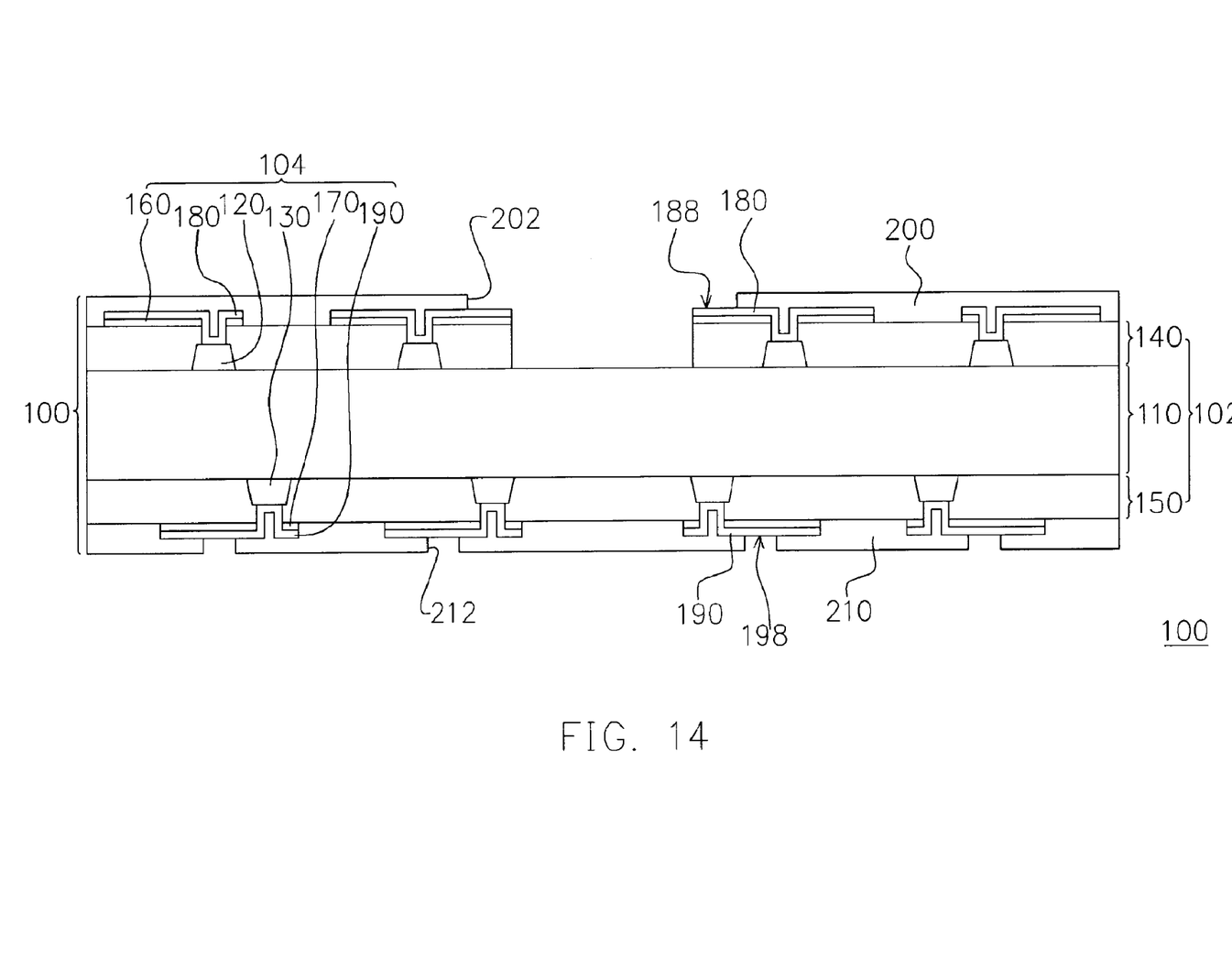

Subsequently, a laser method or a plasma method is used to remove the solder masks 200, 210 exposed through the openings 222, 232 respectively so that the solder mask 200 is formed with an opening 202 connecting with the opening 222 of the metal layer 220 and the solder mask 210 is formed with many openings 212 connection with the openings 232 of the metal layer 230. The core layer 110, the first opening 142 of the dielectric layer 140 and the metal layer 180 are exposed through the opening 202 of the solder mask 200 and the opening 222 of the metal layer 220. The metal layer 190 is exposed through the openings 212 of the solder mask 210 and the opening 232 of the metal layer 230. Next, the metal layers 220, 230 are removed from the surfaces of the solder masks 200, 210 respectively, as shown in FIG. 14. The fabrication of a substrate 100 is completed so far. The metal layer 180 exposed through the opening 202 of the solder mask 200 is defined as conductive pads 188 capable of electrically connecting with outer circuits (not shown). The metal layer 190 exposed through the opening 212 of the solder mask 210 is defined as conductive pads 198 capable of electrically connecting with outer circuits. The substrate 100 is formed with a dielectric structure 102, an interconnection structure 104 and solder masks 200, 210 wherein the interconnection structure 104 interlaces inside the dielectric structure 102 and the solder masks 200, 210 cover the dielectric structure 102 and the interconnection structure 104. The dielectric structure 102 is constructed from the dielectric layers 140, 150 and the core layer 110. The interconnection structure 104 is constructed from the metal layers 120, 130, 160, 170, 180 and 190.

Figure 15:
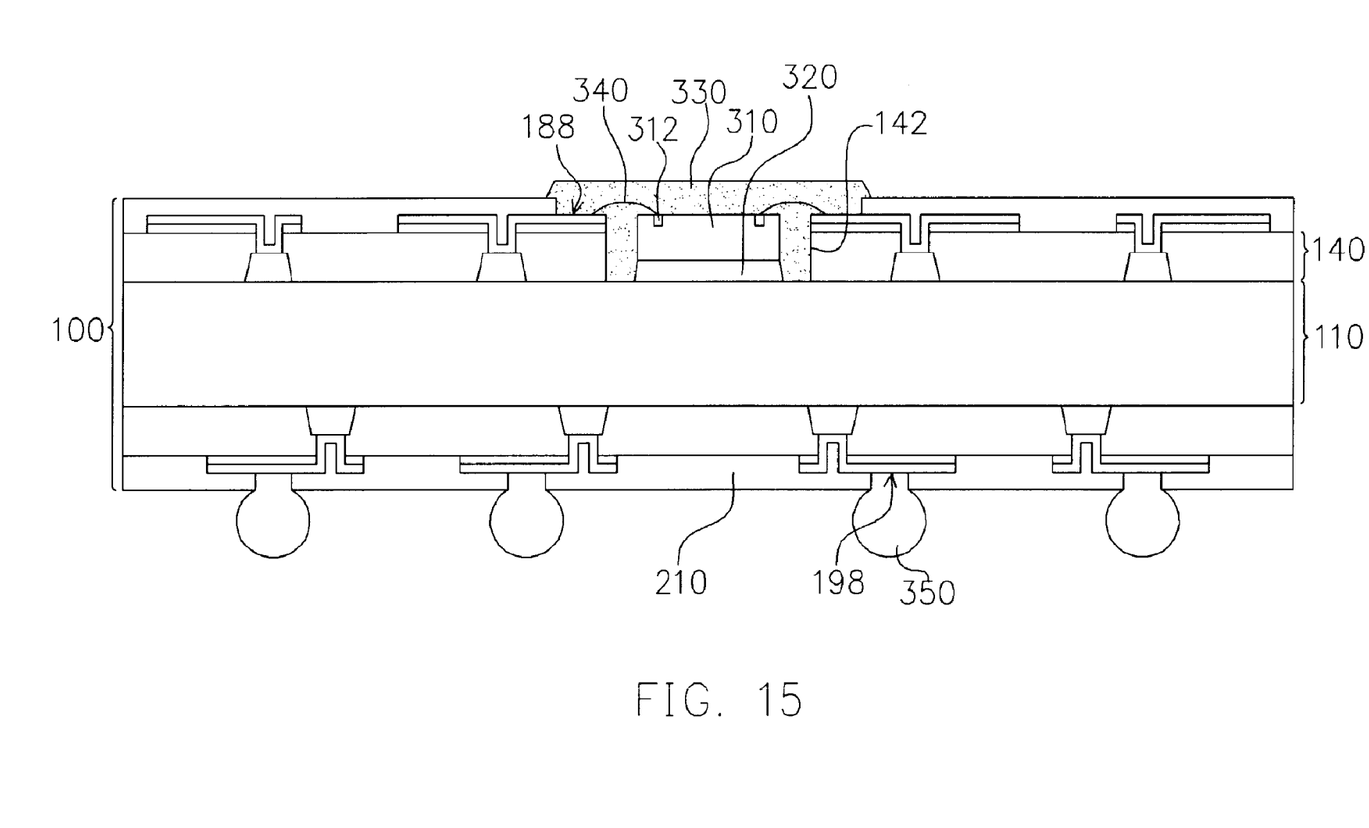

Following, the substrate 100 can be applied to perform a package process, as shown in FIG. 15. A chip 310 can be mounted in the first opening 142 of the dielectric layer 140 and fixed on the core layer 110 by an adhesion layer 320. Using a wire-bonding method, many wires are formed to electrically connect the conductive pads 312 of the chip 310 with the conductive pads 188 of the substrate 100. A molding compound 330 is formed to cover the chip 310, the wires 340 and the first opening 142 of the dielectric layer 140. Many solder balls 350 through which the substrate can be electrically connected with outer circuits are planted on the conductive pads 198.

Moreover, The material of the solder masks 200, 210 can be the same as that of the dielectric layers 140, 150 respectively, so the physical characteristics of the solder mask 200 are similar with those of the dielectric layer 140 and the physical characteristics of the solder mask 210 are similar with those of the dielectric layer 150. Therefore, the connection between the solder mask 200 and dielectric layer 140 is excellent and, also, the connection between the solder mask 210 and dielectric layer 150 is excellent. When the substrate 100 is affected by the heat, both the solder mask 200, 210 and the dielectric layers 140, 150 expand to the same extent, thereby reducing the expansion stresses created between the solder mask 200 and the dielectric layer 140 and between the solder mask 210 and the dielectric layer 150. Therefore, even if the substrate 100 experencespoor conditions, the delamination of the solder mask 200 from the dielectric layer 140 and the delamination of the solder mask 210 from the dielectric layer 150 can be substantially avoided. Moreover, the material of the solder masks 200, 210 can be bismaleimide-triazine (BT) or epoxy resin, both of which are of high glass transition temperature, hence capable of enduring poor conditions. Under poor conditions, the solder masks 200, 210 are of relatively low expansion rate, so the delamination of the solder mask 200 from the dielectric layer 140, the delamination of the solder mask 210 from the dielectric layer 150 and the delamination of the solder mask 200 from the molding compound 330 can be substantially avoided. However, it is not limited that the solder masks 200, 210 have the same material as the dielectric layers 140, 150 respectively, but the solder masks 200, 210 have a coefficient of thermal expansion (CTE) substantially equal to the dielectric layers 140, 150 respectively.

In addition, the method of fabricating the solder mask according to the present invention is not limited to the above process. Referring to FIG. 14, after the solder masks 200, 210 are formed onto the substrate 100, a laser-position-drill process can be used directly to form many openings 202, 212 through the solder masks 200, 210 respectively. The openings 202, 212 expose the metal layers 180, 190 respectively, defining many conductive pads 188, 198. Comparing with the above process, the process of forming metal layers onto the solder masks can be saved.

To sum up, the present has the following advantages.

1. Referring to the method of fabricating a solder mask and the structure of a substrate, the material of the solder mask can be the same as that of a dielectric layer of the dielectric structure, the solder mask contacting the dielectric layer, so the physical characteristics of the solder mask is similar with those of the dielectric layer. Therefore, the connection between the solder mask and dielectric layer is excellent. When the substrate is affected by the heat, both the solder mask and the dielectric layer expand to the same extent, thereby reducing the expansion stresses created between the solder mask and the dielectric layer. Therefore, even if the substrate experience-spoor conditions, the delamination of the solder mask from the dielectric layer can be substantially avoided.

2. Referring to the method of fabricating a solder mask and the structure of a substrate, the material of the solder mask can be bismaleimide-triazine (BT) or epoxy resin, both of which are of high glass transition temperature, hence capable of enduring poor conditions. Under poor conditions, the solder mask is of relatively low expansion rate, so the delamination of the solder mask from the dielectric layer and the delamination of the solder mask from the molding compound can be substantially avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A substrate, comprising:
   a dielectric structure;
   an interconnection structure interlacing inside the dielectric structure; and
   a solder mask covering the dielectric structure, wherein the solder mask has a coefficient of thermal expansion substantially equal to the dielectric structure contacting the solder mask.

2. The substrate according to claim 1, wherein the material of the solder mask is epoxy resin.

3. The substrate according to claim 1, wherein the material of the solder mask is bismaleimide-triazine.

4. The substrate according to claim 1, wherein the solder mask further covers the interconnection structure, the solder mask having at least one opening to expose the interconnection structure.

5. The substrate according to claim 1, wherein the solder mask has the same material as the dielectric structure contacting the solder mask.

6. The substrate according to claim 5, wherein the dielectric structure includes a first dielectric layer and two second dielectric layers on both sides of the dielectric layer, wherein a portion of the interconnection structure is disposed between the first dielectric layer and the second dielectric layer.

7. The substrate according to claim 1, wherein the dielectric structure includes a first dielectric layer and two second dielectric layers on both sides of the dielectric layer, wherein a portion of the interconnection structure is disposed between the first dielectric layer and the second dielectric layer.

8. A substrate, comprising:

a dielectric structure;

an interconnection structure interlacing inside the dielectric structure; and a solder mask covering the dielectric structure, wherein the glass transition temperature of the material used for manufacturing the solder mask is over 200 degree C.

9. The substrate according to claim 8, wherein the solder mask further covers the interconnection structure, the solder mask having at least one opening to expose the interconnection structure.

10. The substrate according to claim 8, wherein the material of the solder mask is epoxy resin.

11. The substrate according to claim 8, wherein the material of the solder mask is bismaleimide-triazine.

* * * * *